(12) United States Patent
Avian

(10) Patent No.: US 7,394,662 B2
(45) Date of Patent: Jul. 1, 2008

(54) OPTIMIZATION OF THE NUMBER OF POWER OUTPUTS FOR AN INTEGRATED CIRCUIT

(75) Inventor: Philippe Avian, Goyrans (FR)

(73) Assignee: Continental Automotive France, Toulouse (FR)

( * ) Notice: Subject to any disclaimer, the term of this patent is extended or adjusted under 35 U.S.C. 154(b) by 0 days.

(21) Appl. No.: 10/586,484

(22) PCT Filed: Jan. 19, 2005

(86) PCT No.: PCT/EP2005/000481

§ 371 (c)(1), (2), (4) Date: Jul. 20, 2006

(87) PCT Pub. No.: WO2005/081314

PCT Pub. Date: Sep. 1, 2005

(65) Prior Publication Data

US 2007/0165364 A1    Jul. 19, 2007

(30) Foreign Application Priority Data

Jan. 21, 2004    (FR) .................................... 04 00525

(51) Int. Cl.
    *H05K 7/00* (2006.01)
(52) U.S. Cl. ..................................... 361/760
(58) Field of Classification Search ............... 361/760, 361/799–780, 761–764
    See application file for complete search history.

(56) References Cited

U.S. PATENT DOCUMENTS

| 6,501,633 B1 | 12/2002 | Toyama et al. |
| 2003/0005862 A1 | 3/2003 | Boylan et al. |
| 2004/0001533 A1* | 1/2004 | Tran et al. .................... 375/141 |
| 2006/0279038 A1* | 12/2006 | Irwin et al. ............... 273/138.1 |

FOREIGN PATENT DOCUMENTS

| DE | 16 65 071 B | 1/1971 |
| DE | 199 51 916 C | 1/2001 |

* cited by examiner

*Primary Examiner*—Jeremy C. Norris
*Assistant Examiner*—Abiy Getachew
(74) *Attorney, Agent, or Firm*—Young & Thompson

(57) ABSTRACT

Method for optimizing the number of power outputs of an electronic control device of the application specific integrated circuit type mounted onto a printed circuit board, the number of power outputs required depending on the application. The method includes mounting into two packages having geometrically identical connecting configurations, an integrated circuit of a first type having a first number of power outputs and an integrated circuit of a second type having a second number of power outputs, respectively, in such a manner as to make the two circuits compatible for their installation on the board, and to provide at least two locations on the board for the installation of the packages, the number of power outputs required for the application being obtained by installing in the locations at least two circuits chosen from between the integrated circuit of the first type and the integrated circuit of the second type.

18 Claims, 2 Drawing Sheets

OPTIMIZATION OF THE NUMBER OF POWER OUTPUTS FOR AN INTEGRATED CIRCUIT

BACKGROUND OF THE INVENTION

1. Field of the Invention

Figure 1:
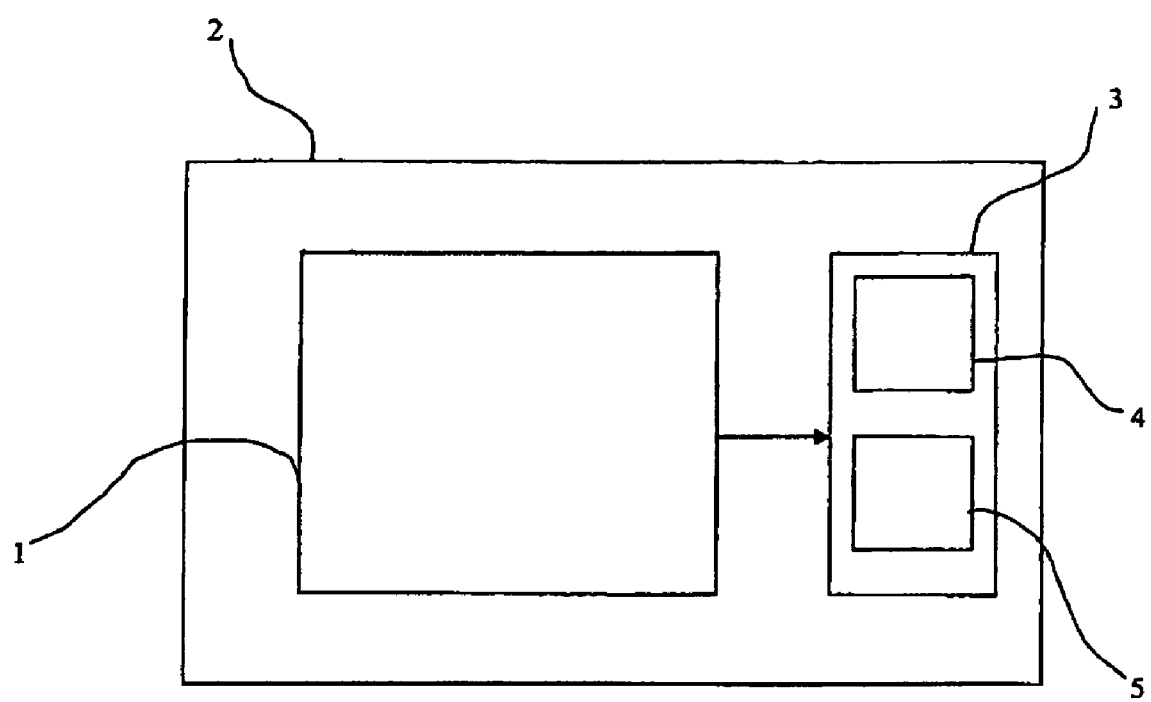

The present invention relates to a method for optimizing the number of power outputs of an electronic control device, of the application specific integrated circuit type mounted onto a printed circuit board, the number of power outputs depending on the application targeted. The present invention more particularly relates to automobile motor control applications, without however being limited to this.

2. Description of the Related Art

Application specific integrated circuits, or ASICs, are integrated circuits designed at the request of the user. Some application specific integrated circuits comprise a central processing unit (for example a digital signal processor, or DSP, in the case of an integrated circuit dedicated to the processing of the signal) associated with a certain number of devices depending on the circuit application, and especially power outputs.

The user therefore provides the manufacturer with the application program for the circuit and information on the configuration of the desired circuit, such as the type and number of power outputs necessary for the application. The integrated circuit is then designed on a chip intended to be mounted on a printed circuit board while associating the specified devices with the central processing units, and especially the power outputs.

In the field of automobile motor control applications for example, the number of power outputs required will vary greatly depending on the type of motor, but will also depend on the application desired by the user. However, in order to reduce the development costs for the application specific integrated circuit manufacturers, the diversity of power output circuits has been reduced while at the same time nevertheless trying to cover the largest range of applications. This goal is however far from being attained.

Thus, for producing a power output stage, manufacturers typically use of 16 output circuits, by means of which designs can be adapted to applications requiring 16 or 32 outputs by applying, for example, one or two circuits of this type. For applications requiring an intermediate number of outputs, manufacturers also use 4 output ASIC circuits which allow them to adapt designs to applications requiring 16, 20, 24, 28, 32, 36 and 40 outputs, for example.

Accordingly, manufacturers currently have a fairly moderate flexibility in the distribution of the number of power outputs required for the application desired by the user. For example, with the configuration described hereinabove, for an application requiring 22 outputs, the manufacturer will not be able to adapt the design exactly to this number of outputs desired by the user and will have to offer a circuit with 24 outputs to meet the requirement. This lack of flexibility in the adaptation of the number of power outputs to the desired application is a problem for the manufacturers since the users clearly do not wish to pay for additional outputs that are unused and which cannot be made use of in their application.

Moreover, the 16 output and 4 output circuit packages imply a different design of the printed circuit board for their installation. They will not therefore be freely interchangeable on a board without modifying its design, which, for the scalability of the number of outputs, leads to additional development costs and a lack of flexibility in the use of these circuits.

The object of the present invention is to overcome these drawbacks by providing a method that allows the number of power outputs available to be optimized as a function of the application desired by the user, so as to be able to ideally cover a wide range of applications with a great flexibility and low cost.

BRIEF SUMMARY OF THE INVENTION

For this purpose, the invention judiciously redistributes various types of power outputs over two integrated circuits and provides for these circuits to be encapsulated such that their mounting onto a printed circuit board is made compatible, in such a manner that all the possible combinations of these two circuits are provided in order to cover, with only these two circuits, the number of outputs required for any kind of application.

With regard to this objective, the subject of the invention is a method for optimizing the number of power outputs of an electronic control device of the application specific integrated circuit type mounted onto a printed circuit board, the number of power outputs required depending on the application, characterized in that it consists in mounting, into two packages having geometrically identical connecting configurations, an integrated circuit of a first type comprising a first number of power output and an integrated circuit of a second type comprising a second number of power outputs, respectively, in such a manner as to make said two circuits compatible for their installation on the printed circuit board, and to provide at least two locations on the board for the installation of said two packages, the number of power outputs required for the application being obtained by installing in said locations at least two circuits chosen from between said integrated circuit of the first type and said integrated circuit of the second type.

According to a first aspect of the invention, the integrated circuit of the first type and the integrated circuit of the second type are designed to have a difference of two outputs.

In one preferred embodiment of the invention, the integrated circuits of the first type and of the second type are encapsulated within package of the PQFN type (acronym for "Power Quad Flat Non-leaded").

In another embodiment, the integrated circuits of the first type and of the second type are encapsulated within a package of the QFN type (acronym for "Quad Flat Non-leaded").

The invention also relates to an electronic control device of the application specific integrated circuit type mounted onto a printed circuit board, said device comprising a stage with power outputs whose number depends on the application targeted, characterized in that said power output stage comprises at least two circuits over which the required number of power outputs is distributed, said two circuits being chosen from a set comprising an integrated circuit of a first type comprising a first number of power outputs and an integrated circuit of a second type comprising a second number of power outputs, said circuits of the first and of the second type being respectively mounted into two packages having geometrically identical connection configurations, in such a manner as to make said two circuits compatible for their installation on the printed circuit board.

According to a first aspect of the invention, the integrated circuit of the first type comprises six power outputs.

According to another aspect of the invention, the integrated circuit of the second type comprises eight power outputs.

Preferably, the integrated circuit of the first type comprises one eight-amp output, three three-amp outputs and two one-amp outputs.

Preferably, the integrated circuit of the second type comprises one eight-amp output, four three-amp outputs and three one-amp outputs.

BRIEF DESCRIPTION OF THE DRAWING FIGURES

Figure 2:
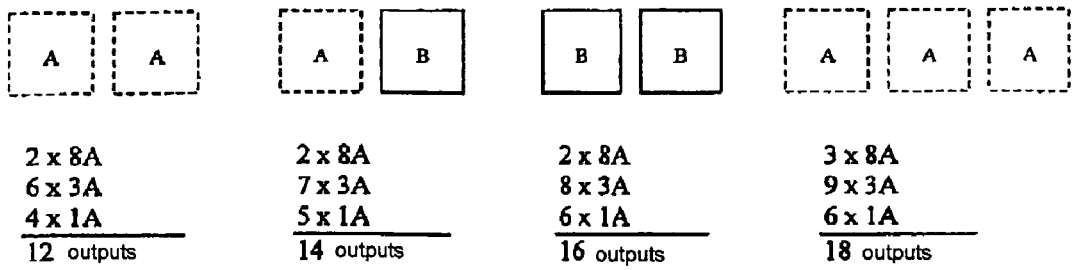
Figure 2:
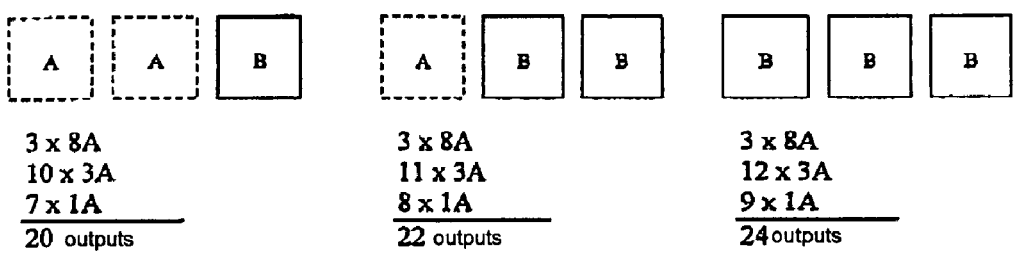
Figure 2:
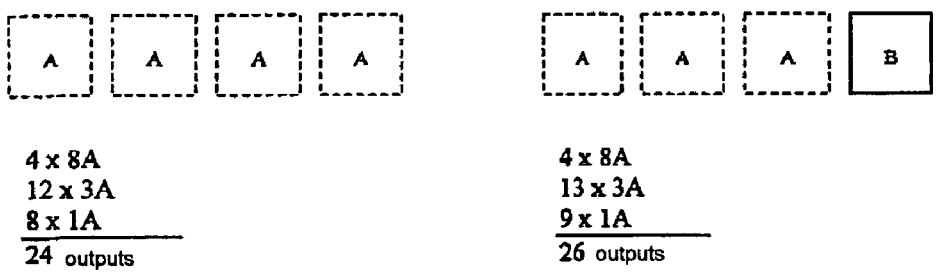

Other features and advantages of the present invention will become more clearly apparent upon reading the following description, presented by way of illustrative but non-limiting example and with reference to the figures, in which:

FIG. 1 shows schematically an electronic control device using printed circuit board technology illustrating the principle of optimization of the number of power outputs according to the present invention, and FIG. 2 shows schematically a set of combinations of integrated circuits of the first type and of integrated circuits of the second type which illustrates the optimum partitioning according to the invention of the number of power outputs for a wide range of applications.

DETAILED DESCRIPTION OF THE PREFERRED EMBODIMENTS

FIG. 1 therefore illustrates an electronic control device that takes the form of a dedicated micro-controller 1 mounted on a printed circuit board 2. This is, for example, a dedicated circuit developed at the request of a user for any given motor control application. The control device especially comprises a power output stage 3 and the number of power outputs depends on the application targeted by the user.

According to the invention, the power output stage 3 comprises at least two integrated circuits of the ASIC type over which the required number of power outputs is distributed. According to one significant feature, the circuits over which the power outputs required for the application are distributed are exclusively chosen from a set consisting of an integrated circuit of a first type, denoted type A, comprising a first number of power outputs and an integrated circuit of a second type, denoted type B, comprising a second number of power outputs.

In the example in FIG. 1, the power output stage comprises two circuits of this type. However, as will be seen in the following, all the possible combinations of circuits of this type may be envisioned in such a manner as to cover all kinds of applications in terms of number of power outputs.

Indeed, the two ASIC circuits are advantageously mounted in two respective packages 4 and 5, which each have geometrically identical connecting configurations so as to make the two circuits of type A and of type B compatible for their installation on the printed circuit board 2. The locations of the two packages are thus interchangeable on the printed circuit board. For this purpose, at least two locations are provided on the board for the installation of these two packages, the number of power outputs required for the application being then obtained by installing, in these predefined locations, at least two circuits chosen from between the integrated circuit of type A and the integrated circuit of type B.

The circuits of type A and B are preferably encapsulated within PQFN-type packages.

These are, for example, PQFN packages having dimensions 9 mm×9 mm and comprising 36 pins. QFN-type packages may also be envisioned for encapsulating the circuits of type A and of type B.

The principle according to the invention of an optimum partitioning of the power outputs with two integrated circuits, and only two, for the whole range of applications, for example for motor control, will now be described with reference to a preferred embodiment illustrated in FIG. 2. FIG. 2 therefore shows a set of circuit combinations covering fairly tightly a wide spectrum of number of power outputs, the circuits installed in order to obtain the number of power outputs desired by the user being chosen from between the integrated circuit of type A and the integrated circuit of type B.

Preferably, the circuit of type A comprising a first number of power outputs and the circuit of type B comprising a second number of power outputs are designed to have a difference of two outputs between them.

In this preferred embodiment, the circuit of type A is a circuit comprising six power outputs and the circuit of type B is a circuit comprising eight power outputs.

More precisely, according to the example in FIG. 2, the circuit of type A comprises one eight-tamp output, three three-amp outputs and two one-amp outputs. The circuit of type B comprises one eight-amp output, four three-amp outputs and three one-amp outputs. The outputs are, for example, configured to draw current toward ground.

These two circuits are preferably mounted in PQFN 9×9 36-pin packages. By mounting these two type A and type B circuits in two packages with geometrically identical connecting configurations, the installation locations of the two type A and type B circuits are interchangeable on the board and therefore all possible combinations may be envisioned.

Accordingly, as illustrated, an application requiring 12 outputs implies the installation of two type A circuits, over which are therefore distributed according to the invention the various types of power outputs, amongst which there are two eight-amp outputs, six three-amp outputs and four one-amp outputs. An application requiring 14 outputs implies the installation of one type A circuit and one type B circuit, over which are distributed the various types of power outputs amongst which there are two eight-amp outputs, seven three-amp outputs and five one-amp outputs. An application requiring 16 outputs implies the installation of two type B circuits, over which are distributed the various types of power outputs, amongst which there are two eight-amp outputs, eight three-amp outputs and six one-amp outputs. An application requiring 18 outputs implies the installation of three type A circuits, over which are distributed the various types of power outputs, amongst which there are three eight-amp outputs, nine three-amp outputs and six one-amp outputs. An application requiring 20 outputs implies the installation of two type A circuits and one type B circuit, over which are distributed the various types of power outputs, amongst which there are three eight-amp outputs, ten three-amp outputs and seven one-amp outputs. An application requiring 22 outputs implies the installation of one type A circuit and two type B circuits, over which are distributed the various types of power outputs, amongst which there are three eight-amp outputs, eleven three-amp outputs and eight one-amp outputs. An application requiring 24 outputs implies the installation of three type B circuits, over which are distributed the various types of power outputs, amongst which there are three eight-amp outputs, twelve three-amp outputs and nine one-amp outputs. A different distribution may also be envisioned for the applications requiring 24 outputs by installing four type A circuits, over which are distributed the various types of power outputs, amongst which there are four eight-amp outputs, twelve three-amp outputs and eight one-amp outputs. An application requiring 26 outputs implies the installation of three type A circuits and one type B circuit, over which are distributed the various types of power outputs, amongst which there are four eight-amp outputs, thirteen three-amp outputs and nine one-amp outputs. By continuing in this manner to multiply the combinations, applications requiring 28, 30, 32, etc. . . . outputs may also be covered.

The specification proposed for the type A and type B circuits with six and eight outputs, respectively, thus allows a wide spectrum of even numbers of power outputs to be covered with a wide flexibility owing to the compatibility of the integrated circuits of type A and of type B for their installation on the board. The judicious distribution proposed for the various types of power output over the two integrated circuits of type A and of type B therefore allows all kinds of applications to be ideally covered since, advantageously, whatever the number of power outputs required for the application targeted by the user, there will never be more than one unused output.

This optimum partitioning of the power outputs for a whole range of applications, resulting from a combination of at least two circuits chosen from between the integrated circuit of type A with six outputs and the integrated circuit of type B with eight outputs, moreover offers an advantageous cost-performance ratio.

Although the invention has been described with reference to preferred exemplary embodiments, it will be understood these examples are not limiting and that various modifications may be made to them while still remaining within the scope of the invention, in particular with respect to the specification of the numbers of outputs for the circuits of type A and of type B, and also to the types of packages employed.

The invention claimed is:

1. A method for optimizing a number of power outputs of an electronic control device of an application specific integrated circuit type (1) mounted onto a printed circuit board (2), the number of power outputs required depending on the application, comprising:
   mounting into two packages (4, 5) having geometrically identical connecting configurations, an integrated circuit of a first type comprising a first number of power outputs and an integrated circuit of a second type comprising a second number of power outputs, respectively, in such a manner as to make said two circuits compatible for their installation on the printed circuit board (2), and to provide at least two locations on the board for the installation of said two packages (4, 5), the number of power outputs required for the application being obtained by installing in said locations at least two circuits chosen from between said integrated circuit of the first type and said integrated circuit of the second type.

2. The method as claimed in claim 1, wherein the integrated circuit of the first type and the integrated circuit of the second type are designed to have a difference of two outputs.

3. The method as claimed in claim 1, wherein the integrated circuits of the first type and of the second type are encapsulated within a package of the PQFN type.

4. The method as claimed in claim 1, wherein the integrated circuits of the first type and of the second type are encapsulated within a package of the QFN type.

5. An electronic control device of an application specific integrated circuit type (1) mounted onto a printed circuit board (2), said device comprising:
   a stage (3) with power outputs whose number depends on the application targeted, wherein said power output stage comprises at least two circuits over which the required number of power outputs is distributed, said two circuits being chosen from a set comprising an integrated circuit of a first type comprising a first number of power outputs and an integrated circuit of a second type comprising a second number of power outputs, said circuits of the first and of the second type being respectively mounted into two packages (4, 5) having geometrically identical connection configurations, in such a manner as to make said two circuits compatible for their installation on the printed circuit board.

6. The device as claimed in claim 5, wherein the integrated circuit of the first type comprises six power outputs.

7. The device as claimed in claim 5, wherein the integrated circuit of the second type comprises eight power outputs.

8. The device as claimed in claim 5, wherein the integrated circuit of the first type comprises one eight-amp output, three three-amp outputs and two one-amp outputs.

9. The device as claimed in claim 5, wherein the integrated circuit of the second type comprises one eight-amp output, four three-amp outputs and three one-amp outputs.

10. The method as claimed in claim 2, wherein the integrated circuits of the first type and of the second type are encapsulated within a package of the PQFN type.

11. The method as claimed in claim 2, wherein the integrated circuits of the first type and of the second type are encapsulated within a package of the QFN type.

12. The method as claimed in claim 3, wherein the integrated circuits of the first type and of the second type are encapsulated within a package of the QFN type.

13. The device as claimed in claim 6, wherein integrated circuit of the second type comprises eight power outputs.

14. The device as claimed in claim 6, wherein the integrated circuit of the first type comprises one eight-amp output, three three-amp outputs and two one-amp outputs.

15. The device as claimed in claim 7, wherein the integrated circuit of the first type comprises one eight-amp output, three three-amp outputs and two one-amp outputs.

16. The device as claimed in claim 6, wherein the integrated circuit of the second type comprises one eight-amp output, four three-amp outputs and three one-amp outputs.

17. The device as claimed in claim 7, wherein the integrated circuit of the second type comprises one eight-amp output, four three-amp outputs and three one-amp outputs.

18. The device as claimed in claim 8, wherein the integrated circuit of the second type comprises one eight-amp output, four three-amp outputs and three one-amp outputs.

* * * * *